(12) United States Patent
Walsh

(10) Patent No.: US 10,993,349 B2
(45) Date of Patent: Apr. 27, 2021

(54) DISTRIBUTABLE MODULAR CHASSIS

(71) Applicant: Legrand AV, Inc., Fairfield, NJ (US)

(72) Inventor: Brendan K. Walsh, Belvidere, NJ (US)

(73) Assignee: Legrand AV Inc., Fairfield, NJ (US)

( * ) Notice: Subject to any disclaimer, the term of this patent is extended or adjusted under 35 U.S.C. 154(b) by 0 days.

(21) Appl. No.: 16/660,309

(22) Filed: Oct. 22, 2019

(65) Prior Publication Data

US 2020/0154595 A1 May 14, 2020

Related U.S. Application Data

(60) Provisional application No. 62/767,225, filed on Nov. 14, 2018.

(51) Int. Cl.
*H05K 7/14* (2006.01)
*H01R 13/639* (2006.01)
*H01R 25/14* (2006.01)

(52) U.S. Cl.
CPC ....... *H05K 7/1492* (2013.01); *H01R 13/6395* (2013.01); *H01R 25/14* (2013.01); *H01R 25/142* (2013.01)

(58) Field of Classification Search
CPC .. H05K 7/1492; H01R 13/6395; H01R 25/14; H01R 25/142
See application file for complete search history.

(56) References Cited

U.S. PATENT DOCUMENTS

| 6,424,525 B1 * | 7/2002 | MacLeod ................. G06F 1/16 |
| | | 312/223.1 |
| 8,622,756 B2 | 1/2014 | Smed |
| 8,882,536 B2 | 11/2014 | Utz |
| 10,334,751 B2 | 6/2019 | Corbo et al. |

(Continued)

FOREIGN PATENT DOCUMENTS

| DE | 29802689 U1 | 10/1998 |
| EP | 2323235 A2 | 5/2011 |
| WO | 2011161533 A1 | 12/2011 |

OTHER PUBLICATIONS

Extended European Search Report dated Feb. 7, 2020 in corresponding EP Appl. No. 19208561.1.

(Continued)

*Primary Examiner* — Jacob R Crum
(74) *Attorney, Agent, or Firm* — Faegre Drinker Biddle & Reath LLP

(57) ABSTRACT

A power distribution system for providing power, data and/or signals including a chassis with an open channel formed on one side. At least one line buss is mounted on the inside of at least one sidewall and configured to be connected to a power source for providing AC power. A plurality of power modules are configured to removably mount to the chassis and receive power/data/signals from the chassis. Each module includes a housing with walls. A front wall includes openings with one outlet port accessible through the openings. Electrical circuitry in the housing coverts or transmits power, data or communication signals to the outlet port. One or more line connections protrude out from at least one of the walls and are located so as to come into contact with one of the associated busses in the chassis when the module is attached to the chassis.

16 Claims, 2 Drawing Sheets

(56) References Cited

U.S. PATENT DOCUMENTS

| | | | | |
|---|---|---|---|---|
| 2004/0029445 A1* | 2/2004 | Chapman | ............ | H01R 25/162 |
| | | | | 439/607.05 |
| 2009/0236909 A1 | 9/2009 | Aldag et al. | | |
| 2011/0136353 A1* | 6/2011 | Spitaels | ................ | H01B 7/30 |
| | | | | 439/95 |
| 2013/0335983 A1* | 12/2013 | Nicieja | ............... | H01R 25/147 |
| | | | | 362/382 |
| 2018/0358789 A1* | 12/2018 | Corbo | ................... | H01R 41/00 |
| 2019/0239379 A1* | 8/2019 | Smith | ................. | H05K 7/1457 |

OTHER PUBLICATIONS

StarLine Plug-in Raceway, "Flexible Power Solutions", Universal Electric Corporation, dated Feb. 2008, 6 pages.

* cited by examiner

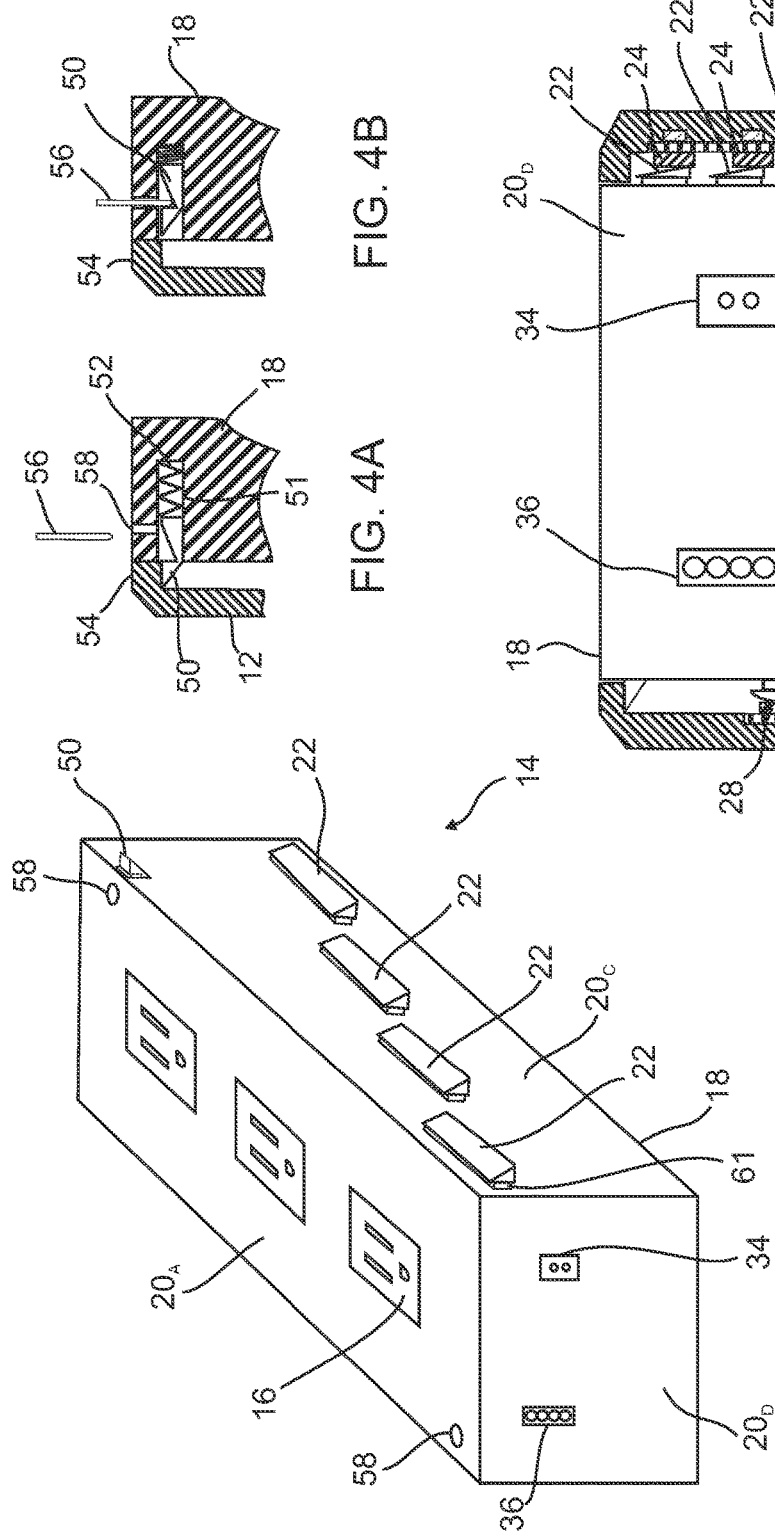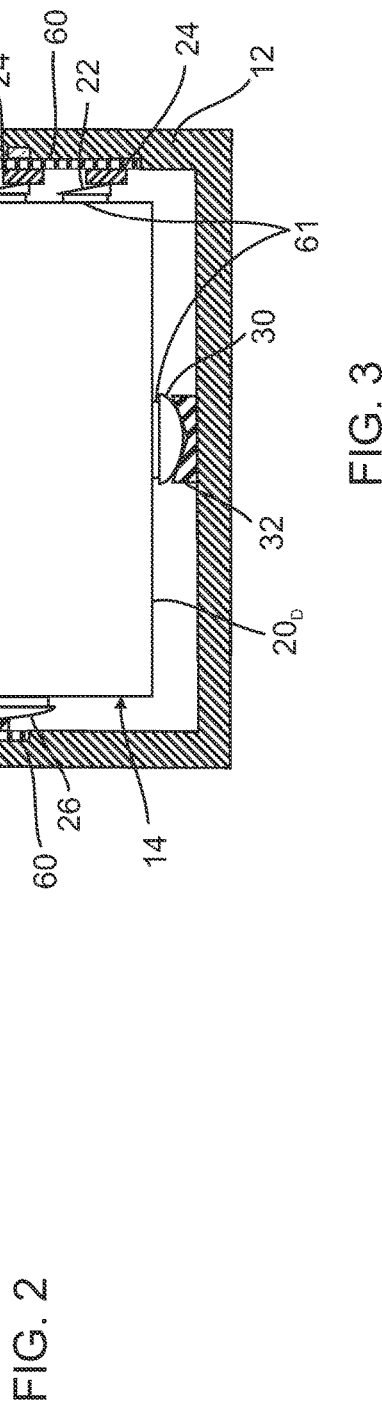

DISTRIBUTABLE MODULAR CHASSIS

RELATED APPLICATION

The present application is related to and claims priority from U.S. Provisional Application No. 62/767,225, filed Nov. 14, 2018, the disclosure of which is incorporated herein by reference in its entirety.

FIELD OF THE INVENTION

The present invention is directed toward an electrical distribution system and, more particular, a power distribution system that uses removable modular chassis for providing power and data connections.

BACKGROUND

One of the problems with power and data distribution in facilities is that the power connections (e.g., outlets, internet connections) are typically restricted to fixed locations. In recent years modular raceways have been introduced that run power and/or data along an extended housing, such as the ceiling in a warehouse or datacenter, with the ability to tap off the raceway at discrete locations as necessary.

Existing raceways are typically limited to supply of AC current at relocatable power taps. One such system is sold under the STARLINE® plug-in raceway sold by Universal Electric Corporation. Thus, while addressing the issue of power distribution, these existing systems do not eliminate the need for AC-DC converters, sometimes referred to as "wall-warts".

A need, therefore, exists for an improved power distribution system that permits AC-DC conversion electronics to be removably mounted into a power raceway.

SUMMARY OF THE INVENTION

A power distribution system is disclosed that is mountable to a structure for providing power, data and/or signal. The system includes an elongated power chassis that is adapted to be mounted to the structure. The chassis has a plurality of side walls with an open channel formed on one side. At least one line buss is mounted on the inside of at least one sidewall of the chassis, the line buss configured to be connected to a power source for providing AC power.

A plurality of power modules are provided that are configured to removably mount to the chassis and receive power/data/signals from the chassis. Each module includes an enclosed housing with a plurality of walls including a front wall, a rear wall opposite from the front wall, two opposed side walls connecting the front wall to the rear wall, and end walls at opposite ends of the housing. The front wall includes one or more openings. At least one outlet port is mounted to the housing and accessible through each opening for connection with external devices to supply electrical communication from the chassis to the external device.

Electrical circuitry is mounted within the housing for converting or transmitting power, data or communication signals to the at least one outlet port.

One or more line connections protrude out from at least one of the side walls or rear wall. The line connection is located on the side wall or rear wall so as to come into contact with one of the associated busses in the chassis when the module is attached to the chassis.

Preferably the outlet port is wired so as to transmit one of either power, data or communication signals.

In an embodiment, the electrical circuitry in the module housing is selected from a group consisting of power conversion electronics for converting power signals from a data connection to a power source, AC-DC conversion electronics, AC controls, AC measurements, and monitoring, data, networking and communication electronics.

The chassis preferably is adapted to receive DC power from a DC supply source and includes an electrical connector mounted within the chassis and configured to connect to the DC supply source. The module housing preferably includes a connector for electrically connecting with the connector on the chassis, the connector on the module housing adapted to receive DC power from the connector on chassis when the chassis is supplied with DC power from the supply source and the module is mounted to the chassis.

In an embodiment the chassis is adapted to receive signals or data from a supply source and includes an electrical connector mounted to an end of the chassis and configured to connect to the supply source. In this embodiment, the module housing includes a connector mounted to an end wall and configured to electrically connect with the connector on the chassis, the connector on the module housing adapted to receive supply of signals or data from the connector on chassis when the chassis is supplied with signals or data from the supply source and the module is mounted to the chassis.

Optionally the connectors on the chassis and the module housing are selected from a group consisting of a RS-485 connector, a RS232 connector, and a Serial Peripheral Interface.

Preferably there are a plurality of line connections protruding from the module housing, each line connection being spaced apart from an adjacent line connection. Preferably the chassis has a plurality of line busses mounted within it, each line buss positioned to come into contact with one of the line connections when the module is mounted to the chassis.

Preferably there are a plurality of outlet ports, each outlet port being electrically connected to a different line connection.

The module housing may include a neutral connection protruding out one of the walls that is different from the side wall from which the line connections protrude; and the chassis includes a neutral buss extending along at least a portion of the chassis. The neutral connection contacts the neutral buss when the module is mounted to the chassis.

The module housing may include a safety ground connection protruding out one of the walls that is different from the side wall from which the line connections protrude; and the chassis includes a ground contact extending along at least a portion of the chassis. The safety ground connection contacts the ground contact when the module is mounted to the chassis.

Preferably the safety ground connection is mounted on the rear wall.

Optionally there are a plurality of line connections and each line connection includes a spring for biasing the line connection outward from the side wall or rear wall.

Optionally the module includes additional connectors for supplying data or signals to a second module mounted to the chassis adjacent to the module.

Preferably the module includes a locking mechanism for securing the module to the chassis. In an embodiment, the locking mechanism is located within a chamber in the module and the module includes an opening in one side wall that provides access to the chamber. The locking mechanism includes a latch that slides within the chamber, and a spring biases a portion of the latch out of the opening so as to engage with a portion of the chassis when the module is mounted to the chassis.

Preferably the housing includes a hole on the front wall, the hole leading into the chamber, and wherein an insertion tool is removably inserted into the hole for unlocking the locking mechanism.

In another embodiment, a power distribution system is disclosed that is mountable to a structure for providing power, data and/or signal lines. The system includes an elongated power chassis adapted to be mounted to the structure, the chassis having a plurality of side walls with an open channel formed on one side. A plurality of line busses are mounted on the inside of at least one sidewall of the chassis and extend along at least a substantial portion of the chassis, the line busses being mounted to the chassis so as to be electrically isolated from one another and from the chassis. Each line buss is configured to be connected to a power source for receiving a supply of power. The chassis includes at least one electrical connector mounted to an end of the chassis and configured to connect to a supply source for receiving signals or data from the supply source.

A plurality of power modules are configured to removably mount to the chassis and receive power/data/signals from the chassis. Each module includes an enclosed housing with a plurality of walls including a front wall, a rear wall opposite from the front wall, two opposed side walls connecting the front wall to the rear wall, and end walls at opposite ends of the housing. The front wall includes a plurality of openings. A plurality of outlet ports are mounted to the housing, each outlet port being accessible through one of the openings to allow electrical connection of external devices. Electrical circuitry is mounted within the housing for converting or transmitting power, data or communication signals to the outlet ports. A plurality of line connections protrude out from one side wall or the rear wall. Each line connection is spaced apart from an adjacent line connection. Each line connection is located on the side wall or rear wall so as to come into contact with one of the associated busses in the chassis, A signal connector is mounted to an end wall and configured to electrically connect with the connector on the chassis, the signal connector on the module is adapted to receive signals or data from the connector on the chassis when the module is mounted to the chassis and the chassis is supplied with signals or data from the supply source.

Each outlet port is electrically connected to a different line connection.

The module housing includes a neutral connection extending out one of the walls that is different from the side wall from which the line connections protrude. The chassis includes a neutral buss extending along at least a portion of the chassis, and the neutral connection contacts the neutral buss when the module is mounted to the chassis.

A locking mechanism is located within a chamber in the module and protrudes out of an opening in one side wall of the module housing. The locking mechanism includes a latch that slides within the chamber, and a spring which biases a portion of the latch out of the opening so that it engages with a portion of the chassis when the module is mounted to the chassis.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

For the purpose of illustrating the invention, there are shown in the drawings embodiments that are presently preferred; it being understood, however, that this invention is not limited to the precise arrangements and constructions particularly shown.

FIG. 2 is a perspective view of an embodiment of the module that can be removably inserted into a chassis of FIG. 1.

FIG. 3 is a cross-sectional view of the chassis of FIG. 1 with the module of FIG. 2 mounted to the chassis.

FIG. 4A is a section view of a portion of the module and chassis illustrating a locking mechanism for securing a module to the chassis of FIG. 1. FIG. 4B illustrates the locking mechanism in its unlocked state in order to remove the module.

BRIEF DESCRIPTION OF THE INVENTION

Figure 1:
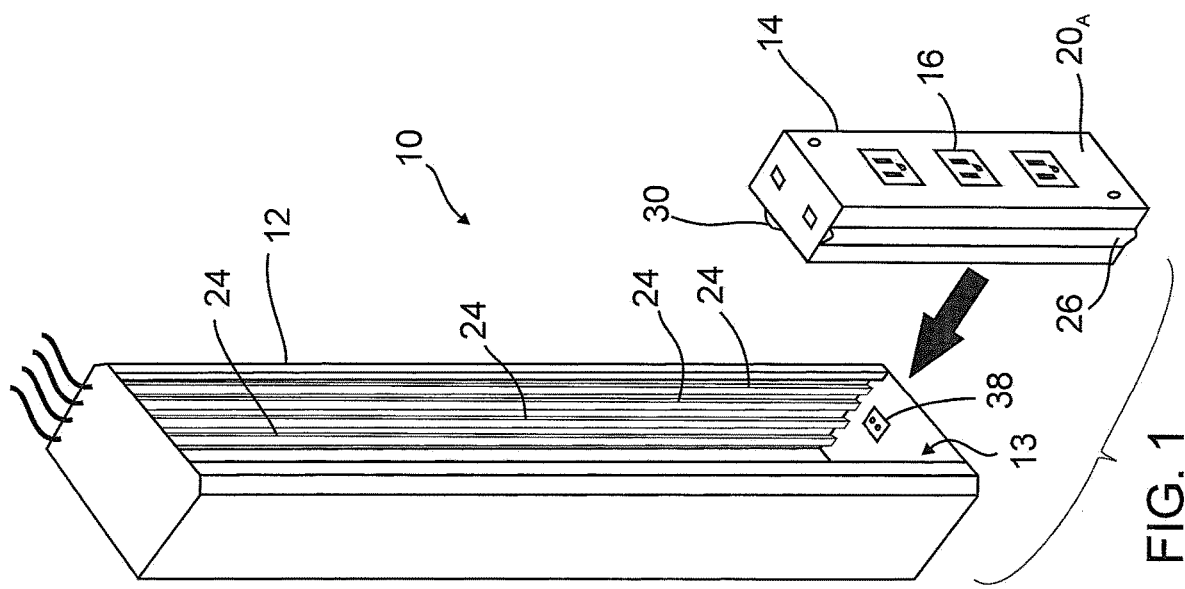
FIG. 1 is a perspective view of an embodiment of a chassis for distributing power to removable modules.

Referring to FIG. 1, the present invention relates to a modular power distribution system 10 that can be mounted in a variety of manners, including vertically (e.g., along racks or walls) or horizontally (e.g., along ceilings or baseboards). The system includes a power chassis or housing 12, which may be in the form of an extended rail with an open channel 13 on one side, that provides power, data and/or signal (communication) lines as will be discussed in more detail below. One or more power modules 14 are removably mountable to the chassis 12 and transmit power/data/signals between chassis 12 and one or more outlets or ports 16 located in the module 14. While a conventional three prong outlet is depicted in the figures, the invention contemplates that the ports 16 can be any electrical communication port, including power, data or signals. FIG. 1 illustrates the module 14 separate from the chassis 12. The arrow depicts the mounting of the module 14 to the chassis 12, i.e., by inserting the module 14 into the open channel 13 of the chassis 12. FIG. 3 is a cross-sectional view illustrating the module 14 mounted in the chassis 12.

The module 14 is in the form of an enclosed housing 18 defined by a plurality of walls 20, including a front wall $20_A$, rear wall $20_B$, side walls $20_C$ and end walls $20_D$. The front wall $20_A$ includes one or more openings through which the outlets 16 are accessible. The front wall $20_A$ may have or comprise a face plate or other decorative covering that is removable so as to permit access to the inside of the housing 18. The interior of the module housing 18 contains the electronics for transmitting power or other communications, such as data or signals to the outlets 16. For example, the module housing 18 may contain power control or power conversion electronics, such as Power Over Ethernet (PoE) circuitry for converting power signals from a data connection to a power source, AC-DC conversion electronics, AC controls, AC measurements and monitoring, data, networking and communication electronics, as well as any combinations thereof.

DC power for controlling internal circuitry within the module housing is also provided, and preferably supplied in a distinct manner from any AC power, as will be discussed below. Some of the input and output contacts may include, but are not limited to, RS-485, RS232, Serial Peripheral Interface, i2c and other communication protocols.

Referring to FIGS. 2 and 3, the module 14 includes one of more line connections 22 that extend or protrude out from one or both of the side walls $20_C$. Preferably the line connections 22 protrude from only one side wall as shown. The line connections 22 are made from a durable conductive material, such as copper or aluminum. If there are more than one line connection 22, the connections are preferably spaced apart from one another and located at specific positions on the module 14 so as to come into contact with line busses 24 that run along and are affixed to one wall of the chassis 18. See, for example, FIG. 2. Each line connection 22 is connected through circuitry located inside the module housing 18 to the electrical components, e.g., outlets, AC controls, etc.

As shown in FIG. 3, each line connection 22 contacts a specific line buss 24 so as to permit electrical communication between the line buss and the line connection 22. A neutral connection 26 preferably extends out of one sidewall $22_C$, preferably on the sidewall opposite the sidewall from which the line connections 22 protrude. When the module 14 is mounted to the chassis 12, the neutral connection 26 is positioned so as to contact a neutral buss 28 running along a wall of the chassis 12.

A safety ground connection 30 protrudes from the module housing 18, preferably on the rear panel $20_B$, and is located so as to contact a ground buss 32 when the module 14 is mounted to the chassis 12.

Any or all of the connections could include springs 61 for biasing the connectors into contact with the busses or vice-versa.

The module 14 also preferably includes connectors on the end walls $20_D$. These connectors are preferably for supplying power (preferably other than AC power), data and/or communications. For example, if the electronic components inside the module 14, such as switches, converters, etc., require power to operate, DC power can be supplied though an appropriate connector. By supplying the DC power through the end wall $20_D$, the present invention permits isolation of DC power from the AC power. FIG. 3 illustrates examples of some suitable connectors, such as a Mill-Max 858 series connector 34 sold by Mill-Max Mfg. Corp., or a RS-485 communications connector 36. Preferably the connectors are arranged so that they can be plugged into a mating connector 38 (either by direct connection or by a cable). Of course, it should be readily appreciated that the DC power could be supplied by a buss extending along a side of the chassis 12 which connects to a separate line connector.

Figure 5:
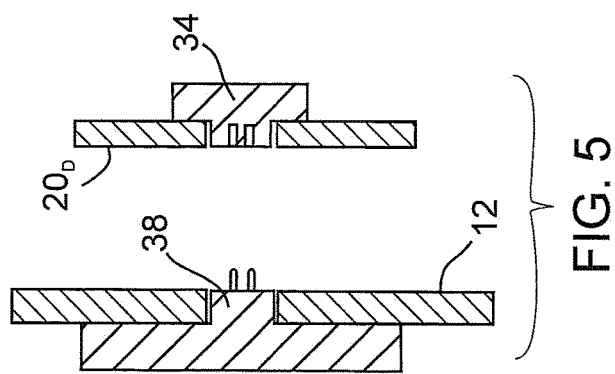
FIG. 5 illustrates a portion of the chassis and module of FIG. 1 illustrating connectors in an end wall for connecting to the chassis.

FIGS. 1 and 5 illustrate an embodiment of a connector 38 attached to an end wall of the chassis 12 with its prongs protruding into the interior of the chassis 12. A mating connector 34 is attached to the end wall $20_D$ of the housing 18 with the receptacles of the connector 34 accessible from outside the housing 18. When the module 14 is inserted into the chassis 12, the module 14 can be slid to an end of the chassis so that the prongs engage with the receptacles. Of course it should be apparent that to permit varied spacing of the modules, cables (not shown) could, instead, be used to connect the connectors 34, 38.

Additionally, connectors 34, 36 as shown in FIG. 5 can be used to provide data and power interconnection between modules. When modules are installed end to end a connector 34, 36, can connect with an associated connector 34, 36 located at the end of another module. It should be apparent that stacking of multiple modules end to end or with the use of cables could be done to create a connected system, or that insertion of a physical barrier such as a Mylar insulator could be used to create two or more subsystems within the same raceway.

In order to lock the modules 14 to the chassis 12, a locking mechanism is preferably included. Referring to FIGS. 3, 4A and 4B, a latch 50 is slidingly disposed within a chamber 51 in the housing 18. A spring 52 preferably biases a portion of the latch 50 outward so that it engages with a lip 54 of the chassis 12. When the module 14 is inserted into the chassis 12, a sloped surface of the latch 50 engages the rim of the opening of the channel 13 forcing the latch 50 to slide into the chamber 51. Once the housing is fully inserted into the cavity of the chassis, the spring 52 biases the latch 50 outward, locking the module 14 into the chassis as shown in FIGS. 3 and 4A.

When it is desired to remove the module 14 from the chassis 12, an insertion tool 56 is inserted into a hole 58 that leads to the chamber 51 in the housing. The insertion tool 56 contacts a sloped surface on the latch 50. As the insertion tool 56 is pushed into the housing 18, the tool 56 slides down the sloped surface, forcing the latch 50 to slide into the chamber 51 and out of engagement with the lip 54. See FIG. 4B.

It should be readily apparent that other locking or securing mechanisms could be used for attaching the modules 14 to the chassis 12.

Removable panels or hinged doors (not shown), could be attached to the chassis between modules 14 to prevent access to the busses. In addition, the busses are preferably mounted to the chassis so as to isolate the busses from the chassis to prevent electrical transmission to the chassis housing, such as through an isolation mount 60, like rubber.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. The various embodiments and elements can be interchanged or combined in any suitable manner as necessary.

The use of directions, such as forward, rearward, top and bottom, upper and lower are with reference to the embodiments shown in the drawings and, thus, should not be taken as restrictive. Reversing or flipping the embodiments in the drawings would, of course, result in consistent reversal or flipping of the terminology.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalent.

What is claimed is:

1. A power distribution system mountable to a structure for providing power, data and/or signal, the system comprising:
   an elongated power chassis adapted to be mounted to the structure, the chassis having a plurality of side walls with an open channel formed on one side, at least one line buss mounted on the inside of at least one sidewall of the chassis, the line buss configured to be connected to a power source for providing AC power; and
   a plurality of power modules configured to removably mount to the chassis and receive power/data/signals from the chassis, each module comprising:
      an enclosed housing having a plurality of walls including a front wall, a rear wall opposite from the front wall, two opposed side walls connecting the front wall to the rear wall, and end walls at opposite ends of the housing, the front wall including one or more openings, at least one outlet port is mounted to the housing and accessible through each opening for connection with external devices to supply electrical communication from the chassis to the external device;
      electrical circuitry mounted within the housing for converting or transmitting power, data or communication signals to the at least one outlet port; and
      at least one line connection protruding out from at least one of the side walls or rear wall, the at least one line connection located on the side wall or rear wall so as to come into contact with one of the associated busses in the chassis when the module is attached to the chassis; and
      wherein the module includes additional connectors for supplying data or signals to a second module mounted to the chassis adjacent to the module.

2. The power distribution system of claim 1, wherein the outlet port is wired so as to transmit one of either power, data or communication signals.

3. The power distribution system of claim 1, wherein the electrical circuitry in the module housing are selected from a group consisting of power conversion electronics for converting power signals from a data connection to a power source, AC-DC conversion electronics, AC controls, AC measurements, and monitoring, data, networking and communication electronics.

4. The power distribution system of claim 1, wherein the chassis is adapted to receive DC power from a DC supply source and includes an electrical connector mounted within the chassis and configured to connect to the DC supply source; and wherein the module housing includes a connector for electrically connecting with the connector on the chassis, the connector on the module housing adapted to receive DC power from the connector on chassis when the chassis is supplied with DC power from the supply source and the module is mounted to the chassis.

5. The power distribution system of claim 1, wherein the chassis is adapted to receive signals or data from a supply source and includes an electrical connector mounted to an end of the chassis and configured to connect to the supply source; and wherein the module housing includes a connector mounted to an end wall and configured to electrically connect with the connector on the chassis, the connector on the module housing adapted to receive supply of signals or data from the connector on chassis when the chassis is supplied with signals or data from the supply source and the module is mounted to the chassis.

6. A power distribution system, mountable to a structure for providing power, data and/or signal, the system comprising:
   an elongated power chassis adapted to be mounted to the structure, the chassis having a plurality of side walls with an open channel formed on one side, at least one line buss mounted on the inside of at least one sidewall of the chassis, the line buss configured to be connected to a power source for providing AC power; and
   a plurality of power modules configured to removably mount to the chassis and receive power/data/signals from the chassis, each module comprising:
      an enclosed housing having a plurality of walls including a front wall, a rear wall opposite from the front wall, two opposed side walls connecting the front wall to the rear wall, and end walls at opposite ends of the housing, the front wall including one or more openings, at least one outlet port is mounted to the housing and accessible through each opening for connection with external devices to supply electrical communication from the chassis to the external device;
      electrical circuitry mounted within the housing for converting or transmitting power, data or communication signals to the at least one outlet port; and
      at least one line connection protruding out from at least one of the side walls or rear wall, the at least one line connection located on the side wall or rear wall so as to come into contact with one of the associated busses in the chassis when the module is attached to the chassis;
   wherein the chassis is adapted to receive signals or data from a supply source and includes an electrical connector mounted to an end of the chassis and configured to connect to the supply source; and wherein the module housing includes a connector mounted to an end wall and configured to electrically connect with the connector on the chassis, the connector on the module housing adapted to receive supply of signals or data from the connector on chassis when the chassis is supplied with signals or data from the supply source and the module is mounted to the chassis; and
   wherein the connectors on the chassis and the module housing are selected from a group consisting of a RS-485 connector, a RS232 connector, and a Serial Peripheral Interface.

7. The power distribution system of claim 1, wherein there are a plurality of line connections protruding from the module housing, each line connection being spaced apart from an adjacent line connection; and wherein the chassis has a plurality of line busses mounted within it, each line buss positioned to come into contact with one of the line connections when the module is mounted to the chassis.

8. The power distribution system of claim 7, wherein there are a plurality of outlet ports, each outlet port being electrically connected to a different line connection.

9. The power distribution system of claim 1, wherein the module housing includes a neutral connection protruding out one of the walls that is different from the side wall from which the line connections protrude; and wherein the chassis includes a neutral buss extending along at least a portion of the chassis, and wherein the neutral connection contacts the neutral buss when the module is mounted to the chassis.

10. The power distribution system of claim 1, wherein the module housing includes a safety ground connection protruding out one of the walls that is different from the side wall from which the line connections protrude; and wherein the chassis includes a ground contact extending along at least a portion of the chassis, and wherein the safety ground connection contacts the ground contact when the module is mounted to the chassis.

11. The power distribution system of claim 10, wherein the safety ground connection is mounted on the rear wall.

12. A power distribution system, mountable to a structure for providing power, data and/or signal, the system comprising:
   an elongated power chassis adapted to be mounted to the structure, the chassis having a plurality of side walls with an open channel formed on one side, at least one line buss mounted on the inside of at least one sidewall of the chassis, the line buss configured to be connected to a power source for providing AC power; and
   a plurality of power modules configured to removably mount to the chassis and receive power/data/signals from the chassis, each module comprising:
      an enclosed housing having a plurality of walls including a front wall, a rear wall opposite from the front wall, two opposed side walls connecting the front wall to the rear wall, and end walls at opposite ends of the housing, the front wall including one or more openings, at least one outlet port is mounted to the housing and accessible through each opening for connection with external devices to supply electrical communication from the chassis to the external device;
      electrical circuitry mounted within the housing for converting or transmitting power, data or communication signals to the at least one outlet port; and
      at least one line connection protruding out from at least one of the side walls or rear wall, the at least one line connection located on the side wall or rear wall so as to come into contact with one of the associated busses in the chassis when the module is attached to the chassis; and
      wherein there are a plurality of line connections and wherein each line connection includes a spring for biasing the line connection outward from the side wall or rear wall.

13. The power distribution system of claim 1, wherein the module includes a locking mechanism for securing the module to the chassis.

14. The power distribution system of claim 13, wherein the locking mechanism is located within a chamber in the module, the module including an opening in one side wall that provides access to the chamber, the locking mechanism including a latch that slides within the chamber, a spring biases a portion of the latch out of the opening so as to engage with a portion of the chassis when the module is mounted to the chassis.

15. The power distribution system of claim 14, wherein the housing includes a hole on the front wall, the hole leading into the chamber, and wherein an insertion tool is removably inserted into the hole for unlocking the locking mechanism.

16. A power distribution system mountable to a structure for providing power, data and/or signal lines, the system comprising:
   an elongated power chassis adapted to be mounted to the structure, the chassis having a plurality of side walls with an open channel formed on one side, a plurality of line busses mounted on the inside of at least one sidewall of the chassis and extending along at least a substantial portion of the chassis, the line busses being mounted to the chassis so as to be electrically isolated from one another and from the chassis, each line buss configured to be connected to a power source for receiving a supply of power, the chassis including at least one electrical connector mounted to an end of the chassis and configured to connect to a supply source for receiving signals or data from the supply source; and
   a plurality of power modules configured to removably mount to the chassis and receive power/data/signals from the chassis, each module comprising:
      an enclosed housing having a plurality of walls including a front wall, a rear wall opposite from the front wall, two opposed side walls connecting the front wall to the rear wall, and end walls at opposite ends of the housing, the front wall includes a plurality of openings, a plurality of outlet ports mounted to the housing, each outlet port being accessible through one of the openings to allow electrical connection of external devices;
      electrical circuitry mounted within the housing for converting or transmitting power, data or communication signals to the outlet ports;
      a plurality of line connections protruding out from one side wall or the rear wall, each line connection being spaced apart from an adjacent line connection, the line connection located on the side wall or rear wall so as to come into contact with one of the associated busses in the chassis,
      a signal connector mounted to an end wall and configured to electrically connect with the connector on the chassis, the signal connector on the module adapted to receive signals or data from the connector on the chassis when the module is mounted to the chassis and the chassis is supplied with signals or data from the supply source; and
      wherein each outlet port is electrically connected to a different line connection;
   wherein the module housing includes a neutral connection extending out one of the walls that is different from the side wall from which the line connections protrude, wherein the chassis includes a neutral buss extending along at least a portion of the chassis, and wherein the neutral connection contacts the neutral buss when the module is mounted to the chassis; and
   a locking mechanism located within a chamber in the module and protruding out of an opening in one side wall of the module housing, the locking mechanism including a latch that slides within the chamber, and a spring which biases a portion of the latch out of the opening so that it engages with a portion of the chassis when the module is mounted to the chassis.

\* \* \* \* \*